(12) United States Patent
Huang et al.

(10) Patent No.: US 6,477,048 B2
(45) Date of Patent: Nov. 5, 2002

(54) HEAT SINK CLIP

(75) Inventors: Ai-Min Huang, Shenzhen (CN); Hsieh Kun Lee, Chung-Ho (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/738,648

(22) Filed: Dec. 15, 2000

(65) Prior Publication Data

US 2001/0006454 A1 Jul. 5, 2001

(30) Foreign Application Priority Data

Dec. 30, 1999 (TW) ...................... 88222452 U

(51) Int. Cl.[7] .............................. H05K 7/20
(52) U.S. Cl. ............... 361/704; 361/702; 361/707; 257/707; 165/80.3
(58) Field of Search .............. 361/704, 707, 361/709–712, 717–719, 722, 687; 174/16.3; 165/80.2, 80.3, 121, 122, 185; 248/316.7, 505, 510; 257/706–727; 411/352, 530; 24/458, 459, 487, 625, 464

(56) References Cited

U.S. PATENT DOCUMENTS

| | | | | |
|---|---|---|---|---|
| 5,486,981 A | * | 1/1996 | Blomquist | 361/704 |
| 5,602,719 A | * | 2/1997 | Kinion | 361/704 |
| 5,671,118 A | * | 9/1997 | Blomquist | 361/704 |
| 5,953,212 A | * | 9/1999 | Lee | 361/709 |
| 6,108,207 A | * | 8/2000 | Lee | 361/207 |
| 6,111,752 A | * | 8/2000 | Huang et al. | 361/704 |
| 6,118,661 A | * | 9/2000 | Lo | 361/704 |
| 6,158,707 A | * | 12/2000 | Chien | 248/510 |
| 6,256,846 B1 | * | 7/2001 | Lee | 24/459 |
| 6,272,722 B1 | * | 8/2001 | Lai | 24/458 |
| 6,304,457 B1 | * | 10/2001 | Liu et al. | 361/799 |

FOREIGN PATENT DOCUMENTS

JP 02000183578 A * 6/2000 ............ H05K/7/20

* cited by examiner

Primary Examiner—Darren Schuberg
Assistant Examiner—Michael Datskovsky
(74) Attorney, Agent, or Firm—Wei Te Chung

(57) ABSTRACT

A heat sink clip (50) is formed from a single piece of resilient metal by stamping. The heat sink clip includes an operation portion (59), a pressing body (51), a first and second arms (54, 57) extending from the opposite ends of the pressing body. The first and second arms each defines an aperture (55, 58) for engaging with a catch (22) on a socket (20) on which an electronic device (30) is mounted. The pressing body presses a heat sink (40) onto the electronic device. The operation portion extends from an end of the pressing body for readily engaging/disengaging the clip.

4 Claims, 3 Drawing Sheets

HEAT SINK CLIP

BACKGROUND

1. Field of the Invention

The present invention relates to a clip and particularly to a clip for a heat sink which readily attaches the heat sink to an electronic device.

2. The Related Art

Certain electronic devices, such as Central Processing Units (CPU), generate a large amount of heat during operation, which deteriorates their operating stability. To counter this problem, a heat sink is often mounted to a CPU for dissipating heat therefrom. Various clips have been used for attaching a heat sink to a CPU.

FIG. 1 shows a conventional clip 1 for attaching a heat sink 7 to a CPU 8 which is attached to a socket 9. The clip 1 comprises an pressing portion 2 for pressing against the heat sink 7 and a pair of spring portions 3 extending from opposite ends of the pressing portion 2. A pair of legs 4 extends downwards from the spring portions 3. Each leg 4 defines two apertures 5, 6 arranged one above the other. The lower apertures 5 receive corresponding catches 11 formed on the socket 9 for closely attaching the heat sink 7 and the CPU 8 to the socket 9. The upper apertures 6 are used to engage with a tool, such as a screwdriver, for engaging or disengaging the lower apertures 5 with or from the catches 11. However, the procedure for assembling/disassembly the heat sink 7 to/from the CPU 8 using the clip 1 is cumbersome and complicated. This is especially so since the assembly/disassembly can not be performed without a tool.

SUMMARY OF THE INVENTION

Accordingly, an object of the present invention is to provide a clip for a heat sink having an operation portion which readily attaches/detaches the heat sink to/from an electronic device.

Another object of the present invention is to provide a clip for securely attaching a heat sink to an electronic device.

To achieve the above-mentioned objects, a heat sink clip is formed from a single piece of resilient metal by stamping, and comprises an operation portion, a pressing body, and a first and second arms extending from opposite ends of the pressing body. The first and second arms each defmes an aperture for engaging with a catch on a socket on which an electronic device is mounted. The pressing body is adapted to press a heat sink onto the electronic device. The operation portion extends from an end of the pressing body for readily engaging/disengaging the clip.

Other objects, advantages and novel features of the present invention will be drawn from the following detailed embodiment of the present invention with attached drawings, in which:

DESCRIPTION OF THE PREFERRED EMBODIMENT

Figure 1:
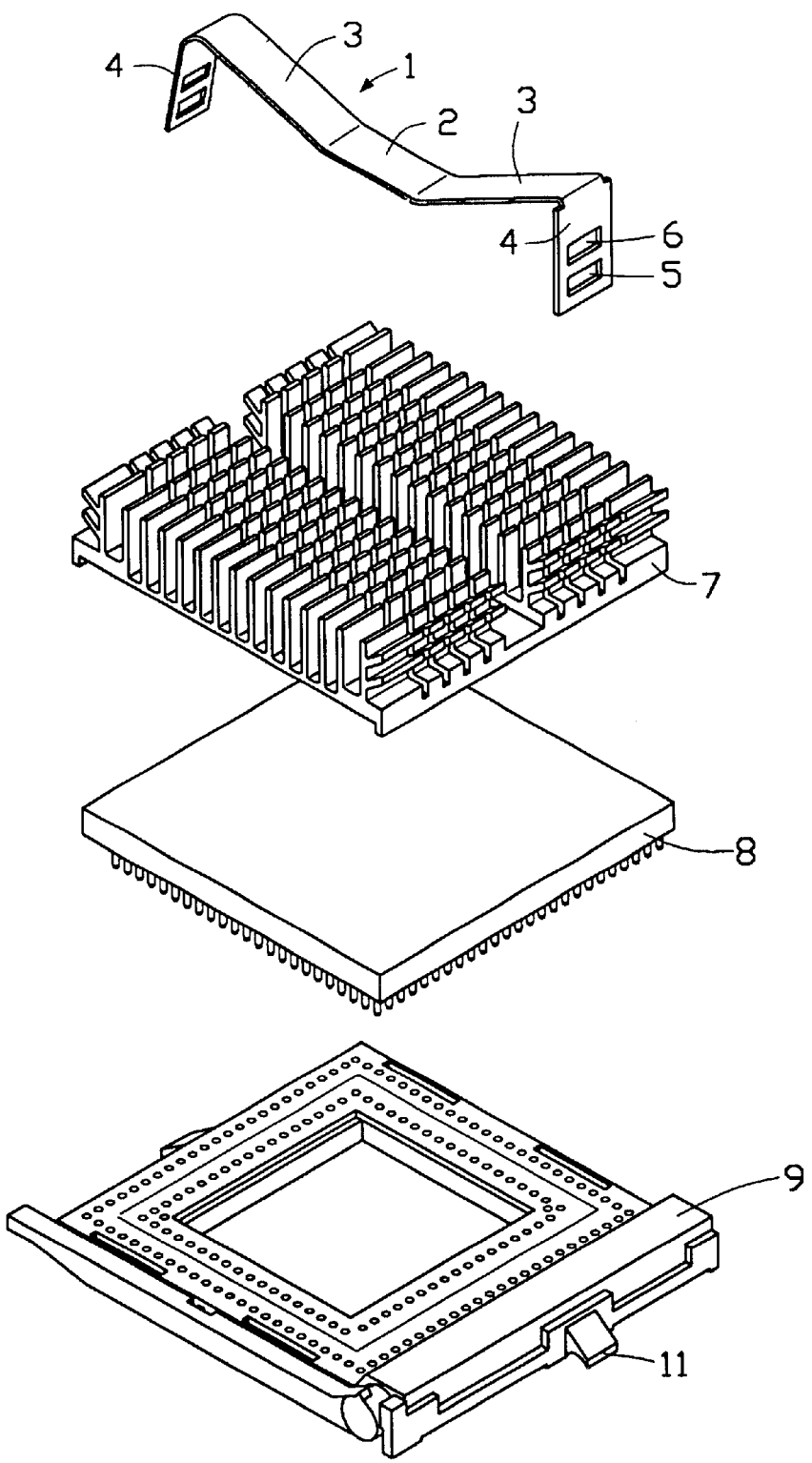
FIG. 1 is an exploded view showing a conventional clip, a heat sink, a CPU, and a socket, all to be assembled together.
Figure 2:
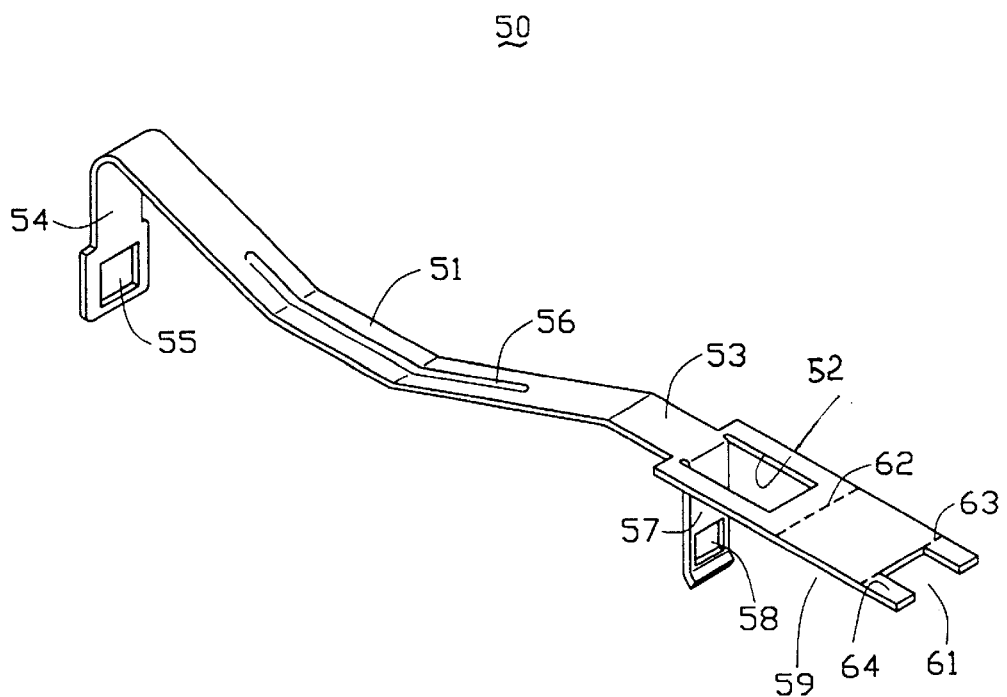
FIG. 2 is a perspective view of a clip of the present invention with an operation portion being unbent.

Referring to FIG. 2, a clip 50 of the present invention is formed from a single piece of resilient metal by stamping. The clip 50 comprises a pressing body 51, a first arm 54 extending downwards from one end of the pressing body 51, a second arm 57 extending downwards from a second end of the pressing body 51, and an operation portion 59 extending outwards from the second end of the pressing body 51. The second arm 57 is formed by stamping from the operation portion 59 and defines an opening 52 in the operation portion 59. The pressing body 51 forms a rib 56 to reinforce the clip 50. The first and second arms 54, 57 each defmes an aperture 55, 58 for engaging with a catch 22 of a socket 20 (shown in FIG. 3). A cutout 61 is defined at the free end of the operation portion 59 to form two wing tabs 64. The width of the cutout 61 is equal to a width of a horizontal section 53, which is formed as part of the second end of the pressing body 51. A reinforced operation portion 59 is formed by upward bending and folding the operation portion 59 back upon itself along a transverse line 62, and then folding the wing tabs 64 backward along a transverse line 63. The wing tabs 64 are folded underneath the operation portion 59, as shown in FIG. 3.

Figure 3:
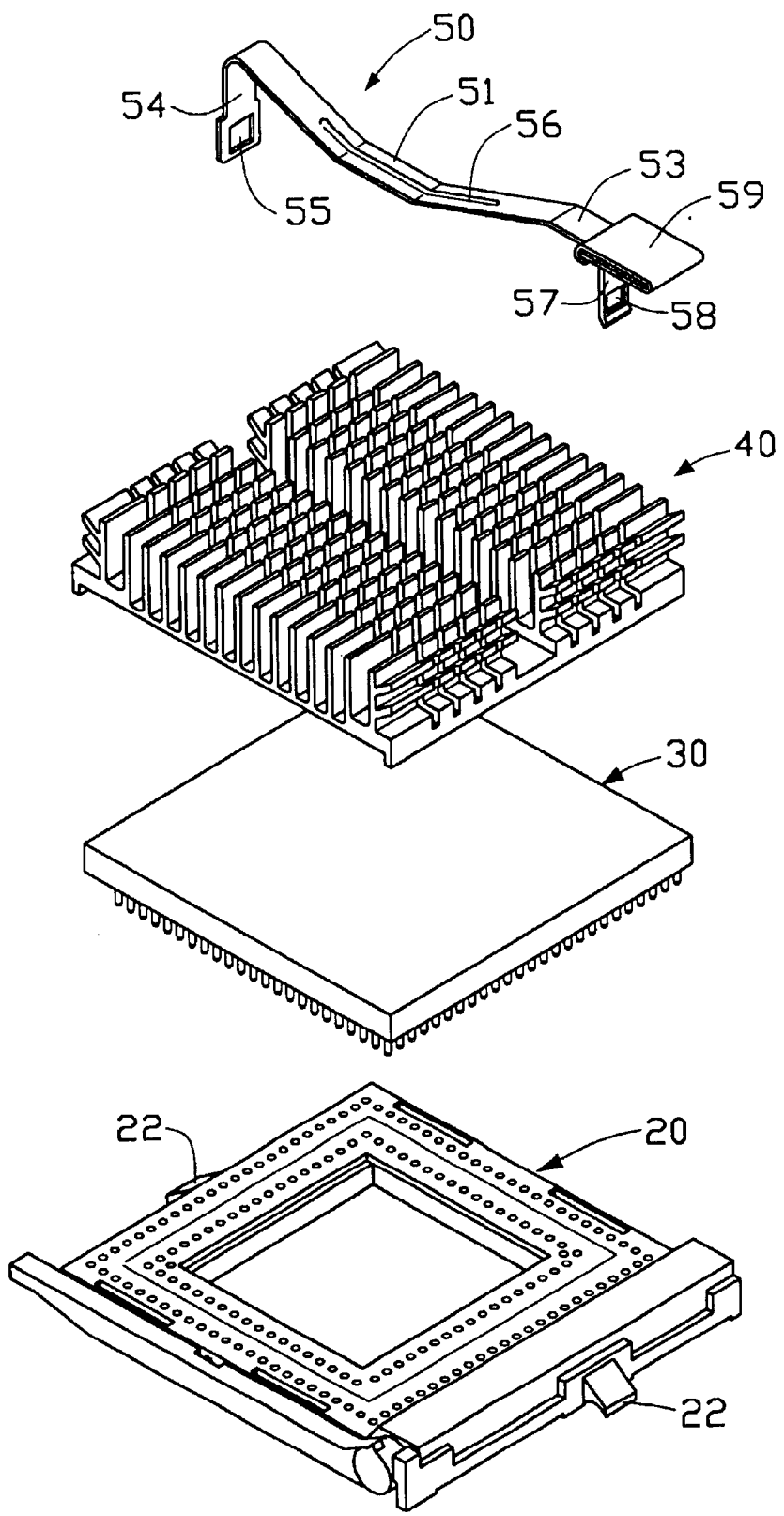
FIG. 3 is an exploded view showing a clip in accordance with the present invention, a heat sink, a CPU, and a socket, all to be assembled together.

Referring to FIG. 3, in assembly, the clip 50 presses a heat sink 40 onto a central processing unit 30 (CPU) mounted on a socket 20. The aperture 55 of the first arm 54 of the clip 50 engages with a catch 22 formed on the socket 20. Because of the operation portion 59, the second arm 57 is easily engaged with a second catch 22 of the socket 20. Thus the heat sink 40 is readily attached to the CPU 30 by the clip 50.

To release the clip 50, the operation portion 59 is depressed to detach the aperture 58 of the second arm 57 from the catch 22 of the socket 20 thereby allowing disengagement of the clip 50 from the heat sink 40 and socket 20.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A heat sink clip comprising:
   a pressing body adapted to press a heat sink onto an electronic device; first and second arms extending downwards from the opposite ends of the pressing body; and
   a reinforced operation portion extending from the end of the pressing body from which the second arm extends, the operation portion being adapted for readily attaching/detaching the heat sink to/from the electronic device, wherein the second arm is formed by stamping from the operating portion, the reinforced operation portion is formed by bending and folding the operation portion back upon itself, and then bending a pair of wing tabs formed on an end of the operation portion and underneath the operation portion.

2. The heat sink clip as described in claim 1, wherein the pressing body defines at least one rib to reinforce the clip.

3. A heat sink clip comprising:
   a pressing body for pressing a heat sink unto an electronic device;
   a first arm extending downwardly from one end of the pressing body;
   an operation portion generally laterally extending the other end of the pressing body; and
   a downwardly extending second arm being stamped out from the operation portion and defining an opening in the said operation portion, wherein the operation portion is backwardly folded to form a tow-layer structure thereof for reinforcement, the operation portion further includes at least one tab to secure the two-layer structure together.

4. A heat sink clip comprising:

a pressing body for pressing a heat sink unto an electronic device, said pressing body defining an longitudinal direction;

first and second arms extending downwardly from two opposite ends of the pressing body; and an operation portion generally laterally extending one of said ends of the pressing body close to the second arm; wherein a width of the operation portion transverse to said longitudinal direction being larger than that of the second arm for easy operation; wherein the operation portion is folded backwardly to form an at-least-two-layers structure, at least one tab is formed at the operation portion to secure the at-least-two-layer structure together.

* * * * *